United States Patent
Oda (10) Patent No.: US 9,916,915 B2
(45) Date of Patent: Mar. 13, 2018

(54) PASTE FOR DIFFUSION LAYER FORMATION AND PRODUCTION METHOD THEREOF AND PRODUCTION METHOD OF GAS DIFFUSION LAYER

(71) Applicant: TOYOTA JIDOSHA KABUSHIKI KAISHA, Toyota-shi, Aichi-ken (JP)

(72) Inventor: Tohru Oda, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 14/897,415

(22) PCT Filed: Sep. 19, 2014

(86) PCT No.: PCT/IB2014/001882
§ 371 (c)(1),
(2) Date: Dec. 10, 2015

(87) PCT Pub. No.: WO2015/044736
PCT Pub. Date: Apr. 2, 2015

(65) Prior Publication Data
US 2016/0197354 A1 Jul. 7, 2016

(30) Foreign Application Priority Data
Sep. 24, 2013 (JP) ................. 2013-196895

(51) Int. Cl.
*H01B 1/18* (2006.01)
*H01B 1/24* (2006.01)
(Continued)

(52) U.S. Cl.
CPC .............. *H01B 1/18* (2013.01); *C09D 11/52* (2013.01); *H01B 1/24* (2013.01); *H01M 4/8673* (2013.01);
(Continued)

(58) Field of Classification Search
CPC ... H01B 1/14; H01B 1/16; H01B 1/18; H01B 1/20; H01B 1/22; H01B 1/24; H01M 4/88;
(Continued)

(56) References Cited

U.S. PATENT DOCUMENTS 7,059,512 B2 * 6/2006 Arita .................. B23K 35/0222
148/23
7,063,913 B2 * 6/2006 Ji ........................ H01M 4/8605
429/465
(Continued)

FOREIGN PATENT DOCUMENTS

JP 2002-367617 12/2002
JP 2010-176947 A 8/2010
JP 2011-258395 12/2011

*Primary Examiner* — Harold Pyon
*Assistant Examiner* — Matthew R Diaz
(74) *Attorney, Agent, or Firm* — Finnegan, Henderson, Farabow, Garrett & Dunner, LLP (57) ABSTRACT

The paste for diffusion layer formation used for formation of a GDL for a fuel cell contains a solvent, and conductive particles, a first surfactant having a first decomposition temperature and a second surfactant having a second decomposition temperature that is lower than the first decomposition temperature, all of which are dispersed in the solvent. The paste for diffusion layer formation contains a lower amount of the first surfactant than the second surfactant on a weight basis.

6 Claims, 10 Drawing Sheets (51) Int. Cl.
  *H01M 4/86* (2006.01)
  *H01M 4/88* (2006.01)
  *C09D 11/52* (2014.01)
  *H05K 1/02* (2006.01)
  *H05K 1/09* (2006.01)
  *H01M 8/023* (2016.01)
  *H01M 8/1018* (2016.01)
  *H01M 8/0232* (2016.01)
  *H01M 8/0234* (2016.01)

(52) U.S. Cl.
  CPC ......... *H01M 4/8807* (2013.01); *H01M 8/023* (2013.01); *H05K 1/092* (2013.01); *H01M 8/0232* (2013.01); *H01M 8/0234* (2013.01); *H01M 2008/1095* (2013.01); *Y02P 70/56* (2015.11)

(58) Field of Classification Search
  CPC ............ H01M 4/8803; H01M 4/8807; H01M 4/8663; H01M 8/023; H01M 8/0232; H01M 8/0234; C09D 5/027; C09D 11/326; C09D 11/38; C09D 11/52; H05K 1/092; H05K 1/095; H05K 1/097
  See application file for complete search history.

(56) References Cited

U.S. PATENT DOCUMENTS

| | | | |
|---|---|---|---|
| 7,098,163 B2* | 8/2006 | Hampden-Smith | B01J 21/18 257/E21.174 |
| 7,722,979 B2* | 5/2010 | Ji | H01M 8/0234 427/115 |
| 2002/0107140 A1* | 8/2002 | Hampden-Smith | B01J 2/003 502/185 |
| 2008/0182090 A1* | 7/2008 | Rouse | C09D 11/52 428/208 |
| 2009/0011308 A1* | 1/2009 | Lee | H01M 4/8807 429/479 |

* cited by examiner

|  | BAKING TIME | | | | | | |
|---|---|---|---|---|---|---|---|
|  | 30s | 45s | 60s | 75s | 90s | 105s | 120s |
| WATER REPELLENCY | δ | χ | β | β | β | β | α |
| BONDING ABILITY | α | β | β | β | χ | δ | δ |

B: A=7 : 1

|  | BAKING TIME | | | | | | |
|---|---|---|---|---|---|---|---|
|  | 30s | 45s | 60s | 75s | 90s | 105s | 120s |
| WATER REPELLENCY | δ | β | β | β | β | α | α |
| BONDING ABILITY | α | β | β | β | χ | δ | δ |

B: A=8 : 1

|  | BAKING TIME | | | | | | |
|---|---|---|---|---|---|---|---|
|  | 30s | 45s | 60s | 75s | 90s | 105s | 120s |
| WATER REPELLENCY | δ | β | β | β | α | α | α |
| BONDING ABILITY | -β | β | β | χ | χ | δ | δ |

GOOD PRODUCT CONDITION

A: WEIGHT OF HIGH-TEMPERATURE DECOMPOSED SURFACTANT X
B: WEIGHT OF LOW-TEMPERATURE DECOMPOSED SURFACTANT Y

FIG.6

|  | BAKING TIME | | | | | | |
|---|---|---|---|---|---|---|---|
|  | 30s | 45s | 60s | 75s | 90s | 105s | 120s |
| WATER REPELLENCY | $\delta$ | $\delta$ | $\chi$ | $\beta$ | $\beta$ | $\beta$ | $\alpha$ |
| BONDING ABILITY | $\alpha$ | $\beta$ | $\beta$ | $\delta$ | $\delta$ | $\delta$ | $\delta$ |

GOOD PRODUCT
CONDITION

FIG. 7

| | | DIFFERENCE IN TEMPERATURE OF DECOMPOSITION BETWEEN SURFACTANTS (°C) | | | |
|---|---|---|---|---|---|
| | | 20 | 30 | 40 | 50 |
| RATIO BETWEEN SURFACTANTS (LOW TEMPERATURE : HIGH TEMPERATURE) | 3 : 1 | δ | δ | δ | δ |
| | 4 : 1 | χ | δ | δ | δ |
| | 5 : 1 | β | χ | δ | δ |
| | 6 : 1 | β | β | χ | χ |
| | 7 : 1 | χ | β | β | β |
| | 8 : 1 | δ | β | β | β |
| | 9 : 1 | δ | χ | β | β |
| | 10 : 1 | δ | δ | β | β |
| | 11 : 1 | δ | δ | χ | β |
| | 12 : 1 | δ | δ | δ | χ |

EVALUATION INDEX

β : RANGE OF APPLICABLE CONDITION (BAKING TIME) IS 45 SEC OR MORE
χ : RANGE OF APPLICABLE CONDITION (BAKING TIME) IS 30 TO 45 SEC
δ : RANGE OF APPLICABLE CONDITION (BAKING TIME) IS 0 TO 30 SEC

|  | BAKING TIME | | | | | | |
|---|---|---|---|---|---|---|---|
|  | 30s | 45s | 60s | 75s | 90s | 105s | 120s |
| WATER REPELLENCY | δ | χ | χ | β | β | β | β |
| BONDING ABILITY | α | β | β | β | χ | δ | δ |

B: A=6 : 1

|  | BAKING TIME | | | | | | |
|---|---|---|---|---|---|---|---|
|  | 30s | 45s | 60s | 75s | 90s | 105s | 120s |
| WATER REPELLENCY | δ | χ | β | β | β | β | α |
| BONDING ABILITY | β | β | β | χ | χ | δ | δ |

GOOD PRODUCT CONDITION

A: WEIGHT OF HIGH-TEMPERATURE DECOMPOSED SURFACTANT X
B: WEIGHT OF LOW-TEMPERATURE DECOMPOSED SURFACTANT Y

|  | BAKING TIME | | | | | |
| --- | --- | --- | --- | --- | --- | --- |
|  | 30s | 45s | 60s | 75s | 90s | 105s | 120s |
| WATER REPELLENCY | δ | χ | χ | β | β | β | β |
| BONDING ABILITY | α | β | β | β | χ | δ | δ |

B: A=8 : 1

|  | BAKING TIME | | | | | |
| --- | --- | --- | --- | --- | --- | --- |
|  | 30s | 45s | 60s | 75s | 90s | 105s | 120s |
| WATER REPELLENCY | δ | χ | χ | β | β | β | β |
| BONDING ABILITY | α | β | β | β | χ | δ | δ |

B: A=9 : 1

|  | BAKING TIME | | | | | |
| --- | --- | --- | --- | --- | --- | --- |
|  | 30s | 45s | 60s | 75s | 90s | 105s | 120s |
| WATER REPELLENCY | δ | χ | β | β | β | β | β |
| BONDING ABILITY | β | β | β | β | χ | δ | δ |

B: A=10 : 1

|  | BAKING TIME | | | | | |
| --- | --- | --- | --- | --- | --- | --- |
|  | 30s | 45s | 60s | 75s | 90s | 105s | 120s |
| WATER REPELLENCY | δ | χ | β | β | β | β | α |
| BONDING ABILITY | β | β | β | χ | χ | δ | δ |

GOOD PRODUCT CONDITION

A: WEIGHT OF HIGH-TEMPERATURE DECOMPOSED SURFACTANT X
B: WEIGHT OF LOW-TEMPERATURE DECOMPOSED SURFACTANT Y

|  | BAKING TIME | | | | | | |
| --- | --- | --- | --- | --- | --- | --- | --- |
|  | 30s | 45s | 60s | 75s | 90s | 105s | 120s |
| WATER REPELLENCY | δ | χ | χ | β | β | β | β |
| BONDING ABILITY | α | β | β | β | χ | δ | δ |

B: A = 8 : 1

|  | BAKING TIME | | | | | | |
| --- | --- | --- | --- | --- | --- | --- | --- |
|  | 30s | 45s | 60s | 75s | 90s | 105s | 120s |
| WATER REPELLENCY | δ | χ | χ | β | β | β | β |
| BONDING ABILITY | α | β | β | β | χ | δ | δ |

B: A = 9 : 1

|  | BAKING TIME | | | | | | |
| --- | --- | --- | --- | --- | --- | --- | --- |
|  | 30s | 45s | 60s | 75s | 90s | 105s | 120s |
| WATER REPELLENCY | δ | χ | β | β | β | β | β |
| BONDING ABILITY | α | β | β | β | χ | δ | δ |

B: A = 10 : 1

|  | BAKING TIME | | | | | | |
| --- | --- | --- | --- | --- | --- | --- | --- |
|  | 30s | 45s | 60s | 75s | 90s | 105s | 120s |
| WATER REPELLENCY | δ | χ | β | β | β | β | β |
| BONDING ABILITY | β | β | β | β | χ | δ | δ |

B: A = 11 : 1

|  | BAKING TIME | | | | | | |
| --- | --- | --- | --- | --- | --- | --- | --- |
|  | 30s | 45s | 60s | 75s | 90s | 105s | 120s |
| WATER REPELLENCY | δ | χ | β | β | β | β | α |
| BONDING ABILITY | β | β | β | χ | χ | δ | δ |

GOOD PRODUCT CONDITION

A: WEIGHT OF HIGH-TEMPERATURE DECOMPOSED SURFACTANT X
B: WEIGHT OF LOW-TEMPERATURE DECOMPOSED SURFACTANT Y

PASTE FOR DIFFUSION LAYER FORMATION AND PRODUCTION METHOD THEREOF AND PRODUCTION METHOD OF GAS DIFFUSION LAYER

CROSS-REFERENCE TO RELATED APPLICATIONS

This application is a national phase application of International Application No. PCT/IB2014/001882, filed Sep. 19, 2014, and claims the priority of Japanese Application No. 2013-196895, filed Sep. 24, 2014, the content of both of which is incorporated herein by reference.

BACKGROUND OF THE INVENTION

1. Field of the Invention

The invention relates to a paste for diffusion layer formation and a production method thereof and a production method of a gas diffusion layer (GDL).

2. Description of Related Art

GDLs sandwich and hold a membrane electrode assembly (MEA) to form a membrane-electrode and gas diffusion layer assembly (MEGA) which is a core member of a fuel cell. GDLs are formed through application of a paste on a diffusion layer substrate and subsequent heat treatment. A paste used for production of GDLs contains conductive carbon particles for imparting preferable conductivity to GDLs, the particle being dispersed in a solvent by making use of a surfactant. The surfactant is required to be decomposed and eliminated together with the solvent during heat treatment after application of the paste. Means for reducing the heating period have been proposed (see, for example, Japanese Patent Application Publication No. 2011-258395 (JP 2011-258395 A)).

GDLs are required to have conductivity, the ability to diffuse and supply gas to electrode catalyst layers of an anode and a cathode in a MEA and bonding ability to electrode catalyst layers in order to maintain the shape of a MEGA. GDLs exhibit conductivity due to carbon which is dispersed in a paste by means of a surfactant. GDLs exhibit water repellency and bonding ability due to a residual surfactant in diffusion layers that has not been decomposed or eliminated during heat treatment after application of the paste. The water repellency and bonding ability are affected by the residual amount of the surfactant. The state of decomposition and elimination of a surfactant from a paste after application is generally defined by the heating state defined by the temperature difference between the heating temperature and the temperature of decomposition of the surfactant and the heating period, and the decomposition and elimination of the surfactant are promoted when the difference is increased. Thus the heating period can also be decreased by increasing the temperature difference. However, as described hereinbelow, it is very much a situation that an increase in the temperature difference cannot be implemented in all cases.

GDLs may have decreased water repellency when the residual amount of a surfactant is high but do not exhibit bonding ability without some amount of a residual surfactant. Thus in view of exhibition of water repellency it is desired to reduce the residual amount of a surfactant while in view of exhibition of bonding ability it is desired to avoid the reduction in the residual amount of a surfactant. Namely in order to exhibit water repellency it is required to increase the temperature difference while in order to exhibit bonding ability it is required not to excessively increase the temperature difference.

The state of decomposition and elimination of a surfactant from a paste after application is affected not only by the heating state defined by the temperature difference and the heating period but also by so-called GDL specifications such as a thickness of an applied paste. The GDL specifications such as a thickness of an applied paste are allowed to have certain production tolerances meeting the production specification of GDLs or MEGAs. Therefore upon heating of GDLs it is required to define the temperature difference and the heating period for GDLs within the product tolerances, so that the heating state is established in which the residual amount of a surfactant gives GDLs both satisfactory water repellency and bonding ability (hereinafter referred to as "appropriate residual amount"). However, the range of the applicable conditions that provides the appropriate residual amount of a surfactant may be narrow because an increase in the temperature difference promotes decomposition and elimination of the surfactant and thus decreases the heating period. Accordingly it is not possible to implement an increase in the heating temperature in all cases and there is room for improvement in reduction of the heating period by increasing the heating temperature. It is also required to miniaturize the production facilities of GDLs and to reduce the production cost.

SUMMARY OF THE INVENTION

A first aspect of the invention relates to a paste for diffusion layer formation which is used for formation of a GDL for a fuel cell. The paste for diffusion layer formation contains a solvent; conductive particles dispersed in the solvent; a first surfactant which is dispersed in the solvent and has a first decomposition temperature at which the first surfactant is decomposed; and a second surfactant which is dispersed in the solvent and has a second decomposition temperature at which the second surfactant is decomposed. The second decomposition temperature is lower than the first decomposition temperature. The paste for diffusion layer formation contains a lower amount of the first surfactant than the second surfactant on a weight basis. When the paste for diffusion layer formation is applied on a diffusion layer substrate and subjected to heat treatment with the diffusion layer substrate, the heating temperature is higher than the first temperature of decomposition of the first surfactant and thus the temperature difference between the heating temperature and the second temperature of decomposition of the second surfactant is increased. By such a heat treatment both first and second surfactants are decomposed and eliminated. If a paste contains only the second surfactant having a low temperature of decomposition, the range of the applicable condition that provides the state of heating resulting in the appropriate residual amount of the surfactant is narrow when the temperature difference between the heating temperature and the second temperature of decomposition of the second surfactant is high. However, the paste for diffusion layer formation contains the first surfactant having a high temperature of decomposition. When the situation of heat treatment of a paste for diffusion layer formation containing only the second surfactant and heat treatment of a paste for diffusion layer formation containing both first and second surfactants at the same heating temperatures reveals that even under application of the condition within the applicable, range for heat treatment of the paste containing only the second surfactant, the first surfactant remains in addition to the second surfactant and thus the total residual amount of the surfactants is increased for the latter case because the temperature difference between the heating temperature and the first temperature of decomposition is smaller than the temperature difference between the heating temperature and the second temperature of decomposition. Thus the range of the applicable condition for the paste containing the second surfactant can be broadened because the first surfactant, in addition to the second surfactant, remains, and thus the GDL can exhibit bonding ability due to the secured residual amount of the surfactants. Further, the paste for diffusion layer formation contains the first surfactant at a weight ratio wherein the weight of the first surfactant is minor, and thus it is prevented that the residual amount of the first surfactant is excessive and thus the GDL can exhibit water repellency. As a result, the paste for diffusion layer formation allows reduction in the heating period by increasing the heating temperature during formation of the GDL, and thus reduction in the time required for formation of the GDL and reduction in cost. Reduction in the heating period may contribute to reduction in the travelling distance in a heating furnace in which the diffusion layer substrate containing the paste applied thereon travels, and thus the paste for diffusion layer formation also allows miniaturization of heating furnace facilities and reduction in the cost for facilities.

In the paste for diffusion layer formation, the weight ratio between the first surfactant and the second surfactant may be decreased as a difference between the first decomposition temperature and the second decomposition temperature is increased. It gives increased options for first and second surfactants and for combinations thereof while allowing exhibition by the GDL of the bonding ability due to the secured residual amount of the surfactants compared to the paste containing only the second surfactant and exhibition by the GDL of water repellency due to prevention of excessive remaining of the first surfactant.

The first surfactant and the second surfactant may be such that the difference between the first decomposition temperature and the second decomposition temperature is 20 to 50° C. It gives increased options for first and second surfactants and for combinations thereof.

The difference between the first decomposition temperature and the second decomposition temperature may be 30 to 40° C. and the weight ratio between the first surfactant and the second surfactant may be 1:6 to 1:8. Accordingly the residual amount of the surfactants can be secured compared to the paste containing only the second surfactant, and the suppression of excessive remaining of the first surfactant can be also secured, and thus the water repellency and bonding ability of the GDL can be highly effectively secured.

A second aspect of the invention relates to a method for producing a paste for diffusion layer formation which is used for formation of a GDL for a fuel cell. The production method includes a preparation step of preparing a first surfactant having a first decomposition temperature at which the first surfactant is decomposed and a second surfactant having a second decomposition temperature at which the second surfactant is decomposed; and a dispersion step of dispersing conductive particles, the first surfactant and the second surfactant in a solvent. The second decomposition temperature is lower than the first decomposition temperature. In the preparation step, an amount of the first surfactant is lower than that of the second surfactant on a weight basis. According to the method for producing the paste for diffusion layer formation, the paste for diffusion layer formation can be easily prepared that allows preparation of GDL exhibiting both bonding ability due to the secured residual amount of the surfactants and water repellency due to suppression of excessive remaining of the first surfactant. The weight of the first surfactant may be decreased as the difference between the first temperature of decomposition and the second temperature of decomposition is increased.

A third aspect of the invention relates to a method for producing a GDL for a fuel cell. The production method includes An application step of applying a paste for diffusion layer formation on a diffusion layer substrate, this paste containing conductive particles, a first surfactant having a first decomposition temperature and a second surfactant having a second decomposition temperature that is lower than the first decomposition temperature, all of which are dispersed in a solvent; and a drying step of subjecting the diffusion layer substrate, which has been applied with the paste, to heat treatment. In the application step, the paste including a lower amount of the first surfactant than the second surfactant on a weight basis is applied on the diffusion layer substrate. The first surfactant is decomposed at the first decomposition temperature and the second surfactant is decomposed at the second decomposition temperature. According to the method for producing the GDL, the GDL that can exhibit bonding ability and water repellency can be easily obtained. The weight of the first surfactant may be decreased as the difference between the first temperature of decomposition and the second temperature of decomposition is increased.

The invention can be practiced in various modes such as a fuel cell containing the GDL formed with the paste for diffusion layer formation and a production method of the fuel cell.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
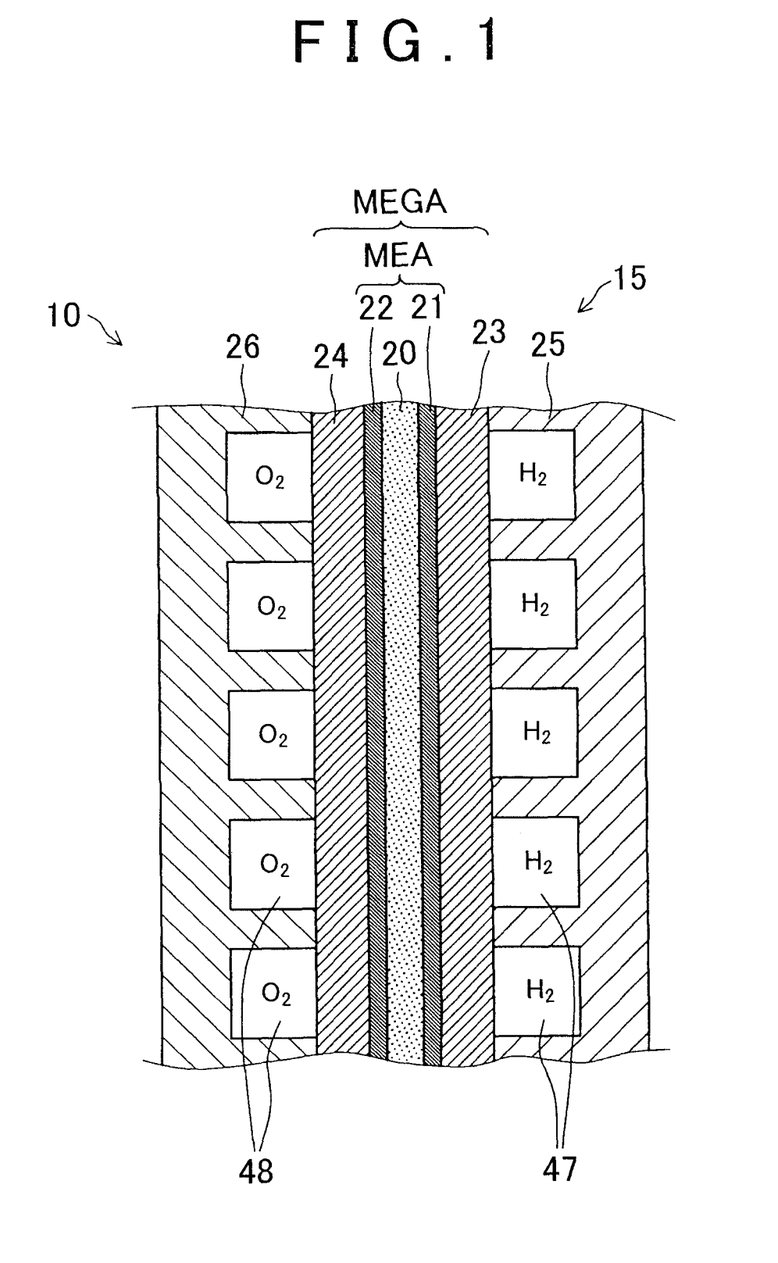
FIG. 1 is an illustration diagram schematically showing the section of a single cell 15 in a fuel cell 10 which is an embodiment of the invention.

The embodiments of the invention are hereinafter described on the basis of the drawings. FIG. 1 an illustration diagram schematically showing the section of a single cell 15 in a fuel cell 10 which is an embodiment of the invention. The fuel cell 10 according to the embodiment is a polymer electrolyte fuel cell including a plurality of stacked single cells 15 shown in FIG. 1, each single cell 15 sandwiched by opposing separators 25 and 26.

The single cell 15 includes two electrodes, i.e., an anode 21 and a cathode 22 on both sides of an electrolyte membrane 20. The electrolyte membrane 20 is a proton conducting ion exchange membrane formed with a solid polymer material, for example a fluororesin and shows preferable electric conductivity under wetting conditions. The anode 21 and the cathode 22 are electrode catalyst layers formed by coating, with an ionomer having proton conductivity, a conductive carrier, for example carbon particles (hereinafter referred to as catalyst-carrying carbon particles) carrying a catalyst such as platinum or a platinum alloy and are bonded to both sides of the electrolyte membrane 20 to form, together with the electrolyte membrane 20, a MEA. The ionomer is generally a polymer electrolyte resin (for example a fluororesin) which is a solid polymer material of the same type as the electrolyte membrane 20 and has proton conductivity due to an ion exchange group thereof.

The single cell 15 further contains an anode side GDL 23 and a cathode side GDL 24 which sandwich and hold the electrolyte membrane 20 containing electrodes formed thereon and separators 25 and 26, and both GDLs are bonded to corresponding electrodes (the anode 21 or the cathode 22). The anode side GDL 23 and the cathode side GDL 24 respectively contain a diffusion layer substrate that is a conductive material having gas permeability, for example, a carbon porous material such as carbon paper and carbon cloth or a metal porous material such as metal mesh or foam metal and is formed by applying to the diffusion layer substrate a paste for diffusion layer formation (hereinafter referred to as "MPL paste") as described hereinbelow and drying. In the embodiment, a MEGA containing a MEA sandwiched by the anode side GDL 23 and the cathode side GDL 24 is produced that serves as a core portion of the single cell 15. Both the anode side GDL 23 and the cathode side GDL 24 may be hereinafter appropriately referred to as GDLs.

The separator 25 has, on the side of the anode side GDL 23, an intra-cell fuel gas passage 47 through which fuel gas containing hydrogen passes. The separator 26 has, on the side of the cathode side GDL 24, an intra-cell oxidizing gas passage 48 through which oxidizing gas (which in the embodiment is air) containing oxygen passes. Although not shown in the figure, an inter-cell refrigerant passage through which a refrigerant passes may be formed between adjacent single cells 15, for example. The separators 25 and 26 are formed with a gas impermeable conductive material, for example, dense carbon which is rendered to be gas impermeable by compressing carbon, glassy carbon or a metal material such as stainless steel.

Although not shown in FIG. 1, the separators 25 and 26 contain a plurality of pores formed in the vicinity of the outer circumferences thereof. When the separators 25 and 26 are stacked with other components for assembly of the fuel cell 10, the pores overlap each other to form passages penetrating the fuel cell 10 along the stacking direction. Namely manifolds are formed that supply and remove fuel gas, oxidizing gas or a refrigerant to and from the intra-cell fuel gas passage 47, the intra-cell oxidizing gas passage 48 or the inter-cell refrigerant passage.

In the fuel cell 10 of the embodiment, hydrogen gas from the intra-cell fuel gas passage 47 in the separator 25 diffuses through the anode side GDL 23 and is supplied to the anode 21. Air from the intra-cell oxidizing gas passage 48 in the separator 26 diffuses through the cathode side GDL 24 and is supplied to the cathode 22. As a result of the supply of gases, the fuel cell 10 generates electricity and the generated electricity is provided to an external load.

Figure 2:
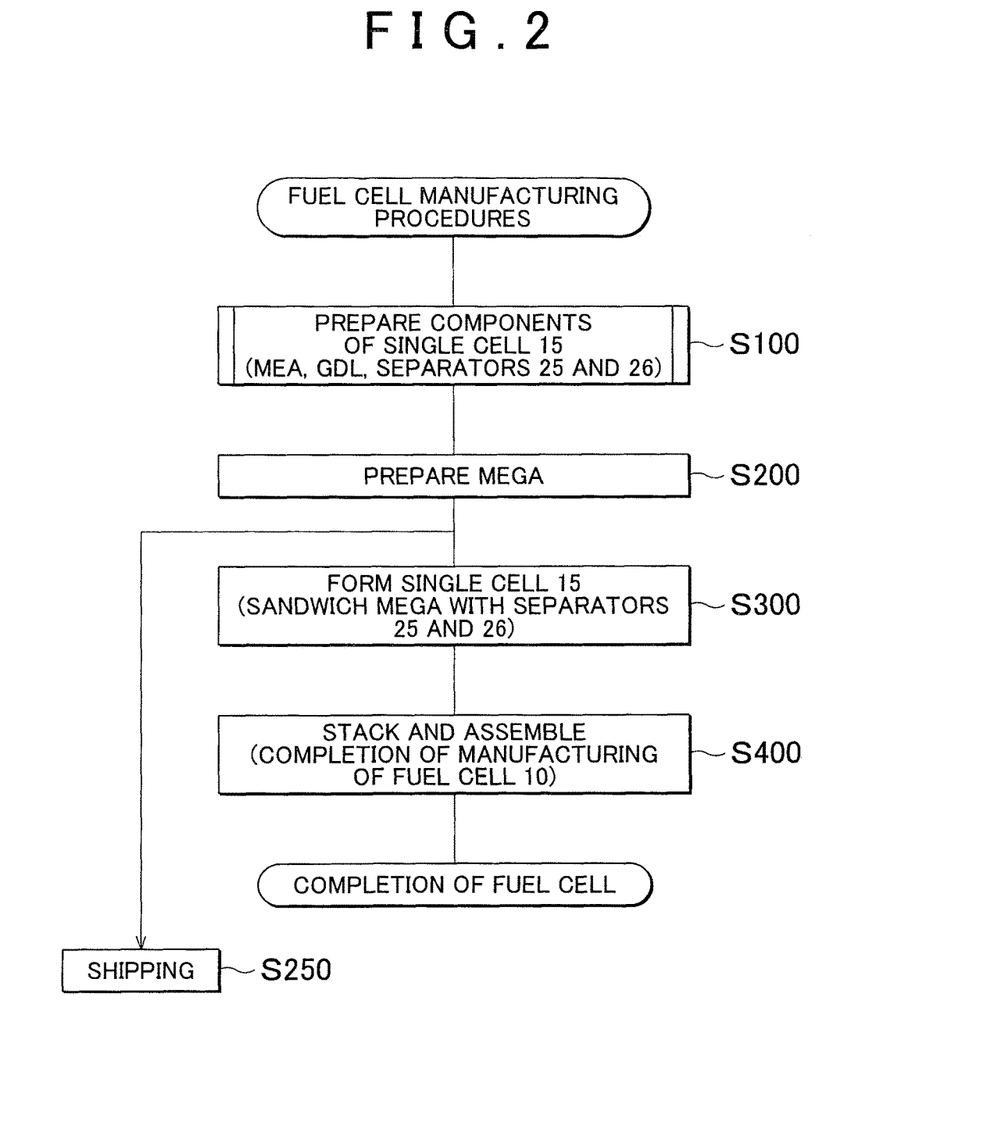
FIG. 2 is an illustration diagram showing a manufacturing procedure of a fuel cell 10.

The method for producing the fuel cell 10 is hereinafter described. FIG. 2 is an illustration diagram showing a manufacturing procedure of the fuel cell 10. As shown in the figure, in order to produce the fuel cell 10, a constituent unit, namely a single cell 15 is first prepared.

In order to prepare the single cell 15, components thereof, i.e., a MEA, GDLs which are an anode side GDL 23 and a cathode side GDL 24, a separator 25 and a separator 26 are provided (step S100). GDLs are prepared by formation thereof, the procedure of which is more specifically described hereinafter. After the components of the single cell 15 are prepared, a MEGA is formed by sandwiching the MEA with the anode side GDL 23 and the cathode side GDL 24 (step S200). The MEGA may be formed as follows, for example:

(a) On both sides of a sheet-like MEA, an anode side GDL 23 and a cathode side GDL 24 are bonded by a procedure as represented by press.

(b) The sheet-shaped MEA with the GDLs bonded thereto is cut into rectangular pieces.

(c) The MEA is sandwiched from both sides with the anode side GDL 23 and the cathode side. GDL 24 to give a rectangular MEGA.

A sheet-shaped MEA may be first cut into rectangular pieces and then may be bonded to both GDLs. The MEGA which has been cut or not may be shipped to a fuel cell production line (step S250).

The MEGA is then sandwiched and held between the separator 25 and the separator 26 to form the single cell 15 (step S300) and a certain amount of single cells 15 are stacked, assembled and fastened along the stacking direction (step S400). Accordingly the fuel cell 10 as shown in FIG. 1 can be obtained.

Figure 3:
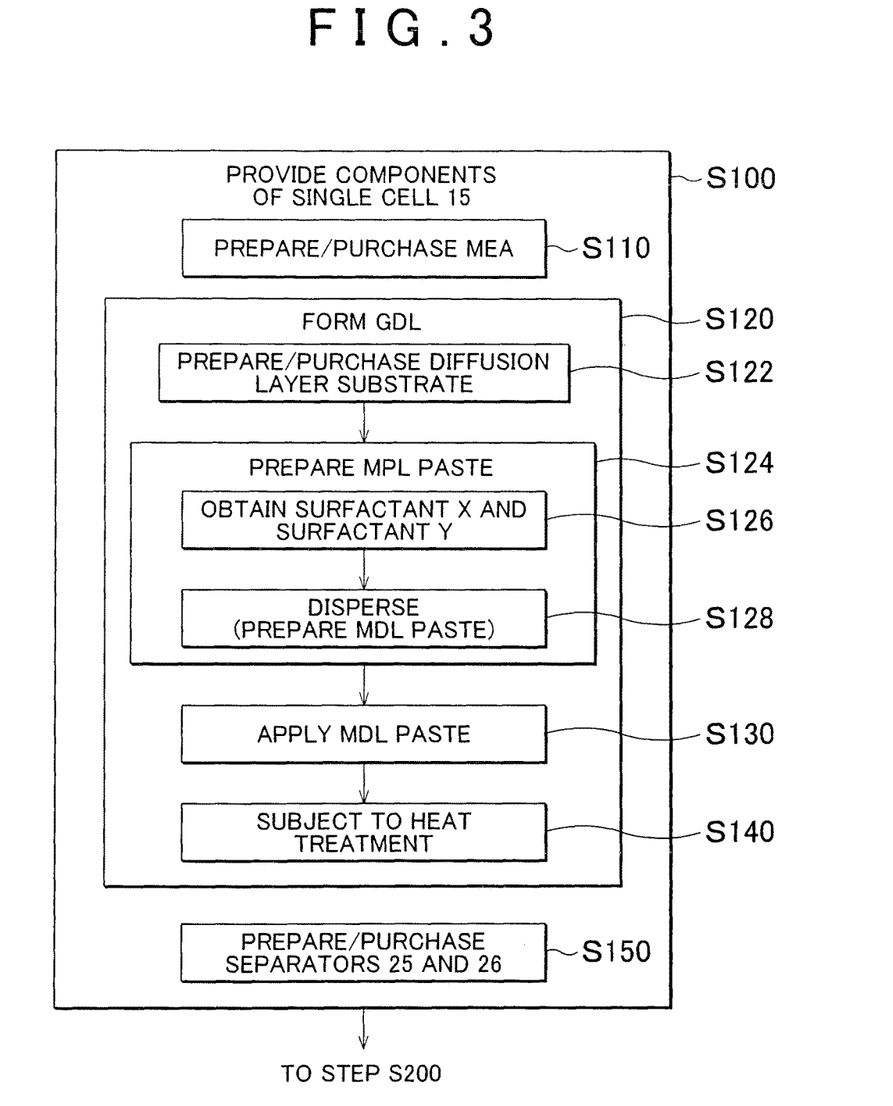
FIG. 3 is an illustration diagram showing a formation procedure of a GDL together with preparation of components of a single cell 15.

Formation of GDLs is now described. FIG. 3 is an illustration diagram showing formation procedures of a GDL together with preparation of components of a single cell 15. As shown in FIG. 3, the preparation of components in step S100 shown in FIG. 2 includes formation of a MEA through preparation or purchase of the MEA (step S110), preparation of GDLs through forming GDLs which eventually serve as an anode side GDL 23 and a cathode side GDL 24 (step S120) and preparation of separators through preparation or purchase of separators 25 and 26 (step S150). The steps may be carried out sequentially or simultaneously in parallel.

Step S120 of forming GDLs through formation thereof includes preparation of a diffusion layer substrate through preparation or purchase of the diffusion layer substrate such as carbon paper or carbon cloth as described above (step S122) and preparation of an MPL (step S124). For preparation of an MPL, two surfactants, i.e., a surfactant X and a surfactant Y are procured through the purchasing thereof (step S126). Both surfactant X and surfactant Y have properties so as to allow dispersion of conductive carbon particles in an organic solvent described hereinafter, and the surfactant X decomposes at a higher temperature of decomposition than that of the surfactant Y. Hereinafter the surfactant X is designated as "high-temperature decomposed surfactant X" and the surfactant Y is designated as "low-temperature decomposed surfactant Y" in order to distinguish therebetween. In the embodiment, the high-temperature decomposed surfactant X has a temperature of decomposition of 288° C. and the low-temperature decomposed surfactant Y has a temperature of decomposition of 258° C. When both surfactants are obtained, the high-temperature decomposed surfactant X and the low-temperature decomposed surfactant Y were weighed so that the weight ratio was within the range (1:6 to 1:8) where the weight of the high-temperature decomposed surfactant X is minor. In other words, the weight ratio B:A is within the range 6:1 to 8:1, wherein A is the weight of the high-temperature decomposed surfactant X and B is the weight of the low-temperature decomposed surfactant Y. After obtainment of the surfactants, carbon particles, a dispersion organic solvent which is polytetrafluoroethylene (PTFE) and both surfactants are added to and dispersed in water to prepare an MPL paste (step S128). Upon preparation of the MPL paste, carbon particles, PTFE, both surfactants and water are weighed at the weight ratio of 8:2:1:40, wherein the weight of the surfactants is expressed as the total weight of the high-temperature decomposed surfactant X and the low-temperature decomposed surfactant Y. Thus the weight ratio of the surfactants (in the embodiment the total weight of the high-temperature decomposed surfactant X and the low-temperature decomposed surfactant Y) relative to carbon particles is the same as that of conventional MPL pastes.

The thus obtained MPL paste is applied on the diffusion layer substrate which has been prepared in step S122 using a coating die or the like (step S130). The diffusion layer substrate onto which the MPL paste has been applied is then transferred to a heating furnace for heat treatment (step S140). The heat treatment decompose and eliminate the high-temperature decomposed surfactant X and the low-temperature decomposed surfactant Y but some of the high-temperature decomposed surfactant X and low-temperature decomposed surfactant Y remain on the diffusion layer substrate. GDLs are then obtained, which are the anode side GDL 23 and the cathode side GDL 24 and have conductivity thanks to carbon particles. The obtained GDLs are subjected to preparation of a MEGA in step S200 shown in FIG. 2. In the embodiment the diffusion layer substrate onto which the MPL paste has been applied was heated at 328° C. which is 40° C. higher than the temperature of decomposition of the high-temperature decomposed surfactant X and 70° C. higher than the temperature of decomposition of the low-temperature decomposed surfactant Y.

Figure 4:
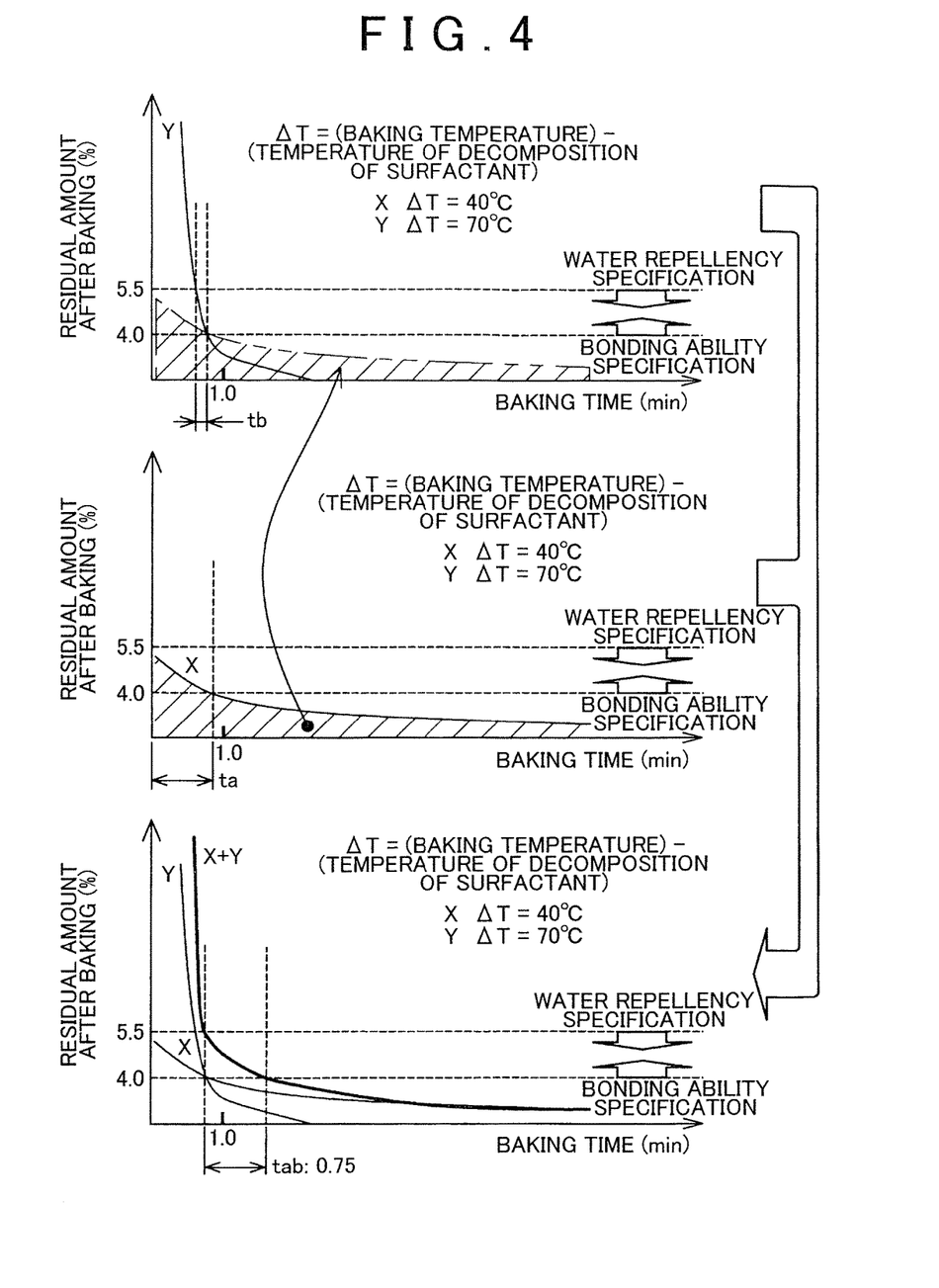
FIG. 4 is an illustration diagram showing the state of the residual surfactants when a paste for diffusion layer formation (micro-porous layer (MPL) paste) containing a high-temperature decomposed surfactant X and a low-temperature decomposed surfactant Y at a certain weight ratio is heated at a heating temperature (328° C.) for GDL formation.

Decomposition and elimination of the high-temperature decomposed surfactant X and the low-temperature decomposed surfactant Y in the MPL paste are now described. FIG. 4 is an illustration diagram showing the state of the residual surfactants when an MPL paste containing a high-temperature decomposed surfactant X and a low-temperature decomposed surfactant Y at a certain weight ratio is heated at a heating temperature (328° C.) for GDL formation. The graph in FIG. 4 schematically shows the behaviour of the residual surfactants in an MPL paste containing carbon particles dispersed in PTFE with a high-temperature decomposed surfactant X and a low-temperature decomposed surfactant Y at the indicated weight ratio (e.g., B:A=6:1).

The upper panel of FIG. 4 shows the behaviour of the residual low-temperature decomposed surfactant Y contained at the above weight ratio. As the low-temperature decomposed surfactant Y exhibits low temperature of decomposition, the temperature difference $\Delta T$ from the heating temperature becomes as high as 70° C. Thus as shown in the upper panel of FIG. 4, the low-temperature decomposed surfactant Y is rapidly decomposed and eliminated within a short period of time and thus a baking time tb that can result in a residual amount (appropriate residual amount) that gives GDLs having both water repellency and bonding ability required therefore is limited to a short period of time. Thus the range of the applicable condition that can result in the appropriate residual amount of the surfactant for the MPL paste only containing the low-temperature decomposed surfactant Y is the baking time tb that is a limitedly short period of time because the temperature difference between the heating temperature and the temperature of decomposition of the low-temperature decomposed surfactant Y is high. The middle panel of FIG. 4 shows the behaviour of the residual high-temperature decomposed surfactant X contained at the above weight ratio. The high-temperature decomposed surfactant X has high temperature of decomposition, resulting in a low temperature difference $\Delta T$ from the heating temperature of 40° C. Thus as shown in the middle panel of FIG. 4, the amount of the high-temperature decomposed surfactant X in the MPL which is low is within the appropriate residual amount from the beginning of heating and the baking time to during which the amount of the high-temperature decomposed surfactant X is within the appropriate residual amount is longer than the baking time tb for the low-temperature decomposed surfactant Y. The lower panel of FIG. 4 shows the behaviour of the residual low-temperature decomposed surfactant Y and high-temperature decomposed surfactant X contained at the above weight ratio. The MPL paste containing both surfactants could realize the baking time tab of about 0.75 min (45 sec) that can provide the appropriate residual amount. The baking time tab is 3 to 4 times longer than the baking time tb for the low-temperature decomposed surfactant Y. This phenomenon can be explained by the fact that the residual amount of the high-temperature decomposed surfactant X as indicated by the shaded area in the middle panel of FIG. 4 is added to the amount of the low-temperature decomposed surfactant Y shown in the upper panel. Namely the MPL paste of the embodiment contains the high-temperature decomposed surfactant X, the temperature difference between the heating temperature and the temperature of decomposition of the high-temperature decomposed surfactant X is decreased under heating conditions corresponding to the range of the applicable condition for a paste only containing the low-temperature decomposed surfactant Y and thus the baking time tb for the paste only containing the low-temperature decomposed surfactant Y can be extended as shown in the lower panel of FIG. 4.

Figure 5:
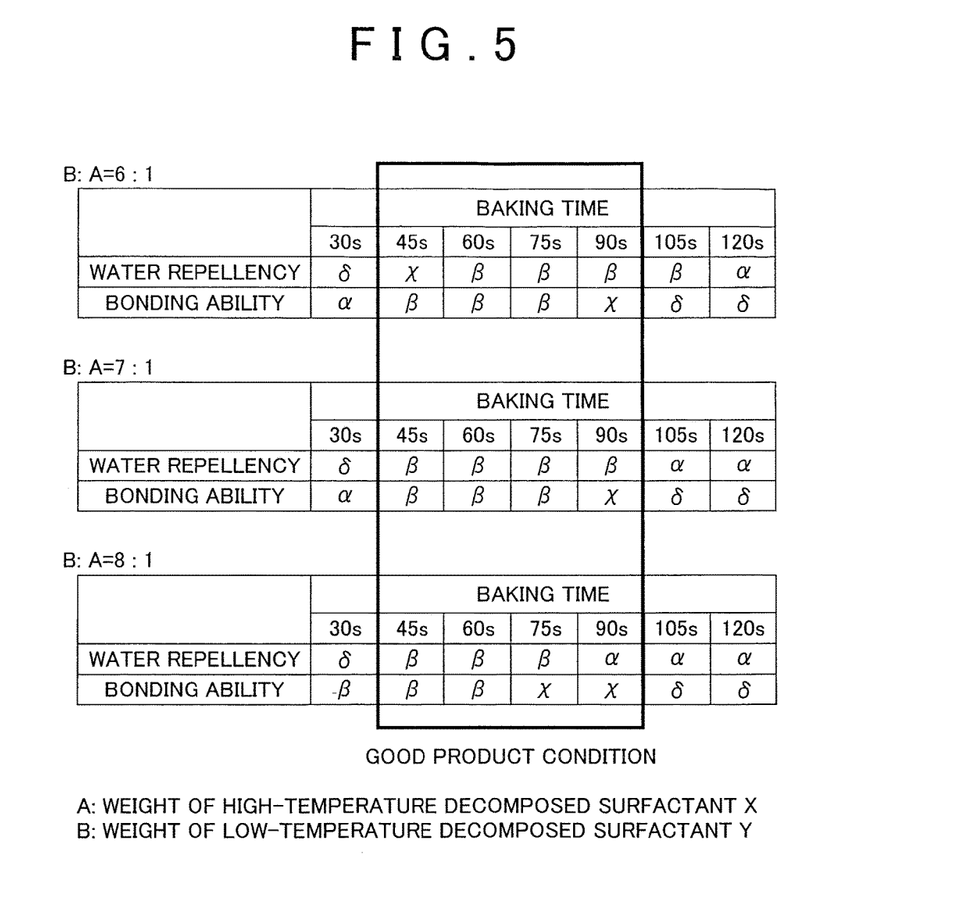
FIG. 5 is an illustration diagram showing the transition of properties of GDLs when MPL pastes containing a high-temperature decomposed surfactant X and a low-temperature decomposed surfactant Y at certain weight ratios are heated at a heating temperature for GDL formation.
Figure 6:
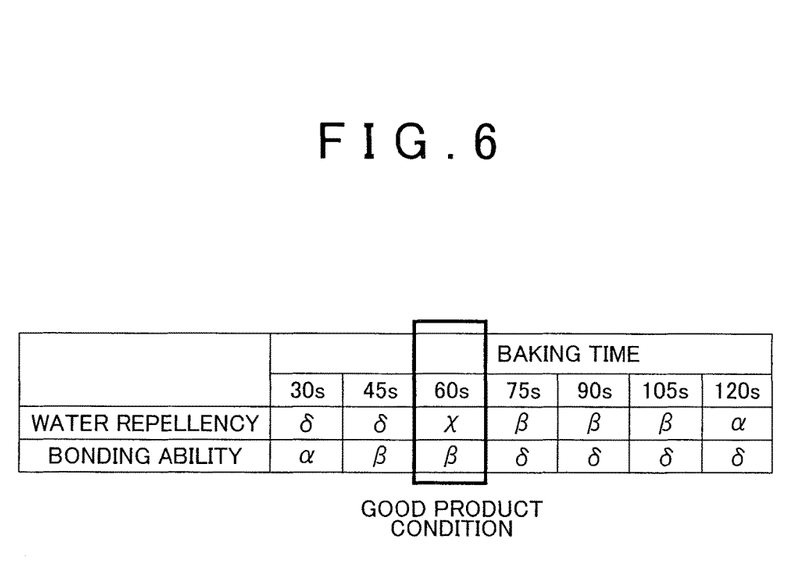
FIG. 6 is an illustration diagram showing the transition of properties of GDLs when MPL pastes containing only a surfactant that is a low-temperature decomposed surfactant Y are heated at a heating temperature for GDL formation.

FIG. 5 is an illustration diagram showing the transition of properties of GDLs when MPL pastes containing a high-temperature decomposed surfactant X and a low-temperature decomposed surfactant Y at certain weight ratios are heated at a heating temperature for GDL formation. FIG. 6 is an illustration diagram showing the transition of properties of GDLs when MPL pastes containing only a surfactant that is a low-temperature decomposed surfactant Y are heated at a heating temperature for GDL formation. In FIGS. 5 and 6, the heating temperature is 328° C., the temperature of decomposition of the high-temperature decomposed surfactant X is 282° C. (temperature difference $\Delta T=40°$ C.) and the temperature of decomposition of the low-temperature decomposed surfactant Y is 252° C. (temperature difference $\Delta T=70°$ C.). In FIGS. 5 and 6, the water repellency of a GDL was judged as α (appropriate) when the contact angle of a water drop on the GDL is 140° or more, β (fair) when the contact angle is in the range of 130° to 140°, χ (acceptable) when the contact angle is in the range of 125° to 130° and δ (unacceptable) when the contact angle is less than 125°. The bonding ability was judged as α (appropriate) when the peeling strength obtained in a certain peeling test (90°: 9 N/m or more) was 15 N or more, β (fair) when the peeling strength is in the range of 12 to 15 N, χ (acceptable) when the peeling strength is in the range of 9 to 12 N and δ (unacceptable) when the peeling strength is less than 9 N. The paste which resulted in χ, β or α for both of the water repellency and the bonding ability was designated as a good product and the baking time that gives a good product was designated as a good product condition.

The good product condition defines, as the heating temperature (328° C.) is constant, the range of the applicable condition (range of the baking time) when the MPL paste of the embodiment is heated at the heating temperature for GDL formation. A MPL paste only containing a low-temperature decomposed surfactant Y has a limited range of the baking time of 60 sec that falls within the good product condition as shown in FIG. 6. On the other hand, the MPL paste of the embodiment containing the high-temperature decomposed surfactant X and the low-temperature decomposed surfactant Y at a weight ratio of 6:1 to 8:1 can have, as shown in FIG. 5, a range of the baking time within the wide range of 45 to 90 sec. FIG. 5 also shows that any MPL paste of the embodiment can provide GDLs having both water repellency and bonding ability with heat treatment for as short time as 45 sec. From the results shown in FIG. 5, it is expected that a paste containing the high-temperature decomposed surfactant X and the low-temperature decomposed surfactant Y at a weight ratio below 6:1 may have a shorter range of the baking time that falls within the good product condition because the weight of the high-temperature decomposed surfactant X is increased and thus the residual amount of the high-temperature decomposed surfactant X is increased, resulting in deterioration of water repellency. It is expected that a paste containing the high-temperature decomposed surfactant X and the low-temperature decomposed surfactant Y at a weight ratio above 8:1 may have a shorter range of the baking time that falls within the good product condition because the weight of the high-temperature decomposed surfactant X is decreased and the residual amount of the high-temperature decomposed surfactant X is decreased as the amount of the low-temperature decomposed surfactant Y, resulting in deterioration of bonding ability.

In order to broaden the range of the applicable condition (range of the baking time) shown in FIG. 6, reduction in the heating temperature is required. On the other hand, the range of the applicable condition (range of the baking time) for the MPL paste of the embodiment shown in FIG. 5 can be broadened even when the heating temperature is increased.

Figure 7:
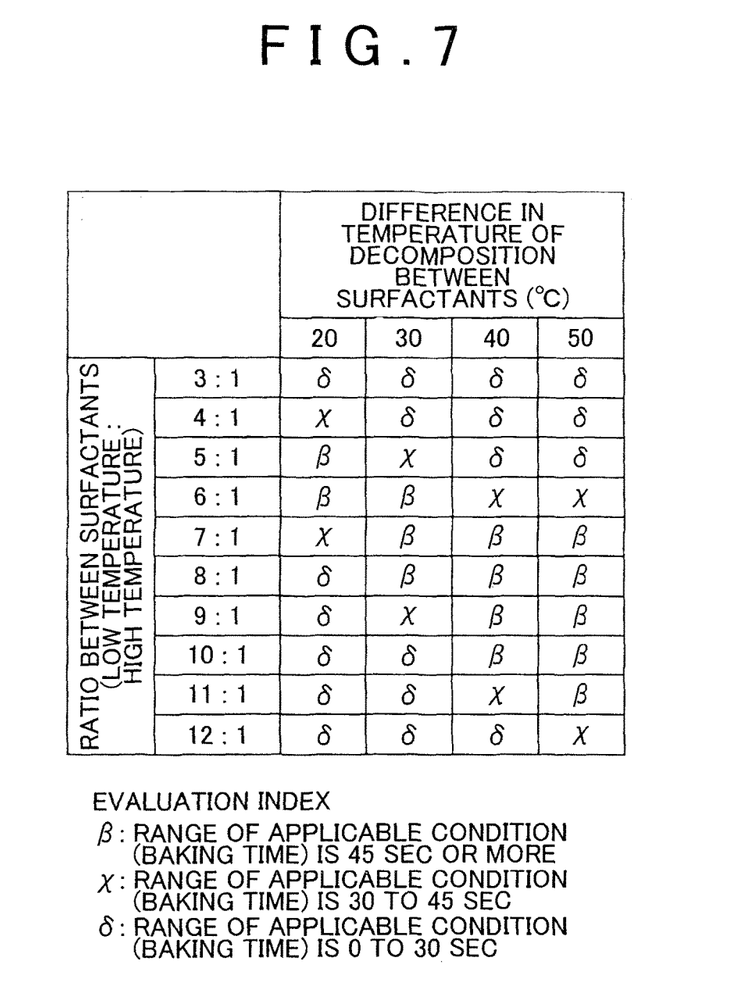
FIG. 7 is an illustration diagram showing the correlation between the weight ratio between a high-temperature decomposed surfactant X and a low-temperature decomposed surfactant Y and the difference in the temperature of decomposition.

FIG. 7 is an illustration diagram showing the correlation between the weight ratio between a high-temperature decomposed surfactant X and a low-temperature decomposed surfactant Y and the difference in the temperature of decomposition. FIG. 7 shows the evaluation of properties of GDLs with the envisaged weight ratios when the difference in the temperature of decomposition between the high-temperature decomposed surfactant X and the low-temperature decomposed surfactant Y is varied. The range of the applicable condition (baking time) of 45 sec or more that gives GDLs having both water repellency and bonding ability was judged to be β (fair) which was a sufficient range of the condition, the range of 30 to 45 sec was judged to be χ (unacceptable) which was relatively narrow and the range of 0 to 30 sec was judged to be δ (poor) which was too narrow. It is concluded from FIG. 7 that a paste containing the high-temperature decomposed surfactant X and the low-temperature decomposed surfactant Y at a weight ratio where the weight of the high-temperature decomposed surfactant X is minor may secure the satisfactory range of the applicable condition at the respective differences in the temperature of decomposition. It is also concluded that a paste containing the surfactants having an increased difference in the temperature of decomposition may secure the satisfactory range of the applicable condition even at the weight ratio where the weight of the high-temperature decomposed surfactant X is decreased.

Figure 8:
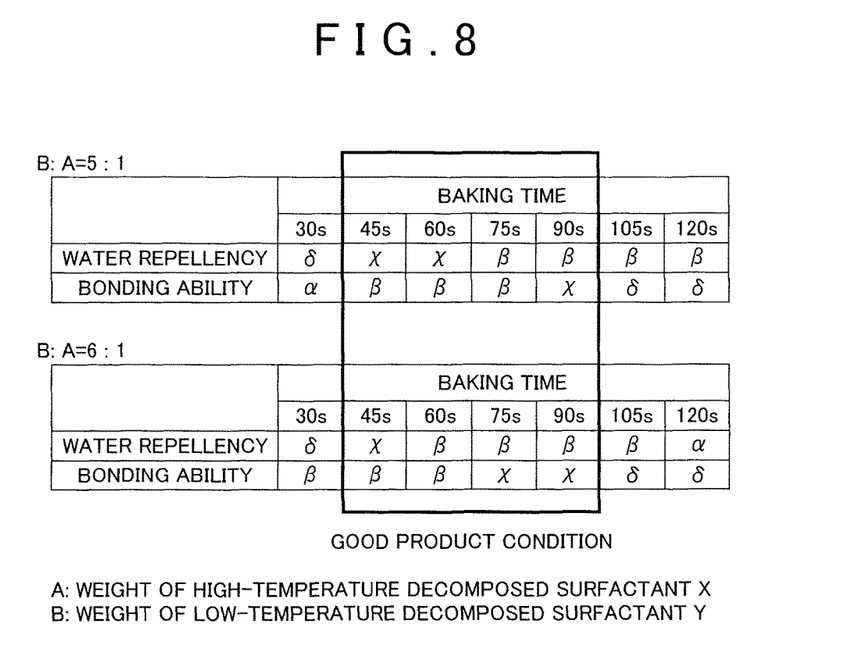
FIG. 8 is an illustration diagram showing the applicable range of the weight ratio between the species when a high-temperature decomposed surfactant X and a low-temperature decomposed surfactant Y are used, which exhibit the difference in the temperature of decomposition of 20° C. and the transition of properties of GDLs.
Figure 9:
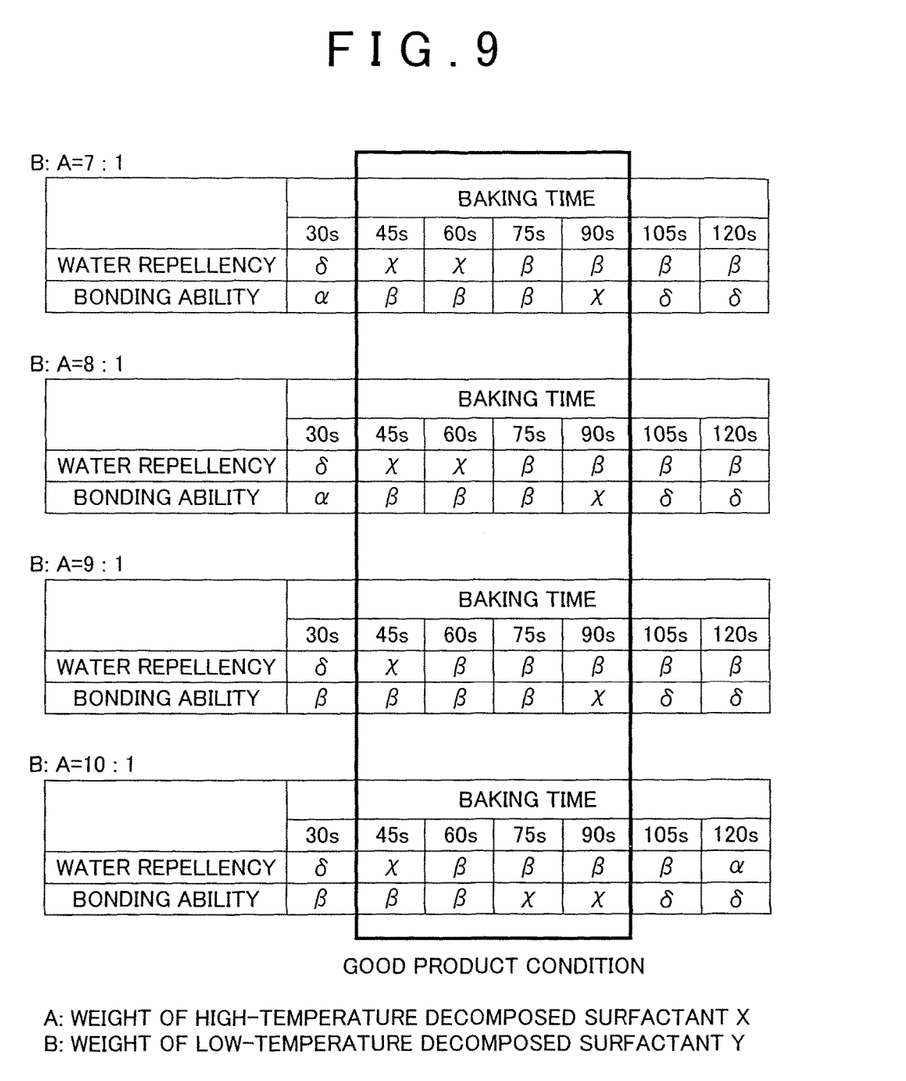
FIG. 9 is an illustration diagram showing the applicable range of the weight ratio between the species when a high-temperature decomposed surfactant X and a low-temperature decomposed surfactant Y are used, which exhibit the difference in the temperature of decomposition of 40° C. and the transition of properties of GDLs.
Figure 10:
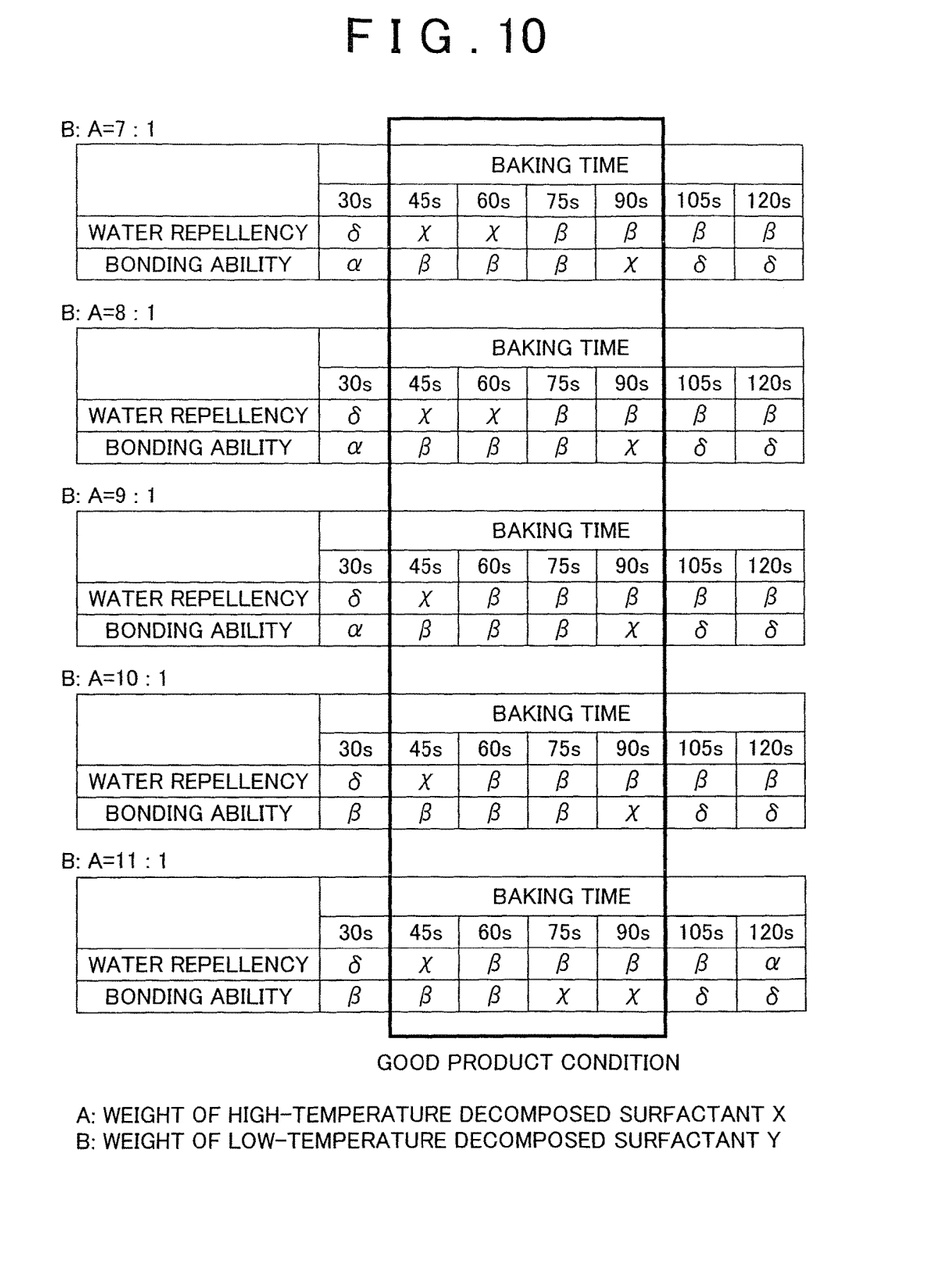
FIG. 10 is an illustration diagram showing the applicable range of the weight ratio between the species when a high-temperature decomposed surfactant X and a low-temperature decomposed surfactant Y are used, which exhibit the difference in the temperature of decomposition of 50° C. and the transition of properties of GDLs.

The relation between the applicable range of the weight ratio between the species with respect to the high-temperature decomposed surfactant X and the low-temperature decomposed surfactant Y at the respective differences in the temperature of decomposition shown in FIG. 7 and the transition of properties of GDLs is now described. FIG. 8 is an illustration diagram showing the applicable range of the weight ratio between the species when a high-temperature decomposed surfactant X and a low-temperature decomposed surfactant Y are used having the difference in the temperature of decomposition of 20° C. and the transition of properties of GDLs. FIG. 9 is an illustration diagram showing the applicable range of the weight ratio between the species when a high-temperature decomposed surfactant X and a low-temperature decomposed surfactant Y are used having the difference in the temperature of decomposition of 40° C. and the transition of properties of GDLs. FIG. 10 is an illustration diagram showing the envisaged range of the weight ratio between the species when a high-temperature decomposed surfactant X and a low-temperature decomposed surfactant Y are used having the difference in the temperature of decomposition of 50° C. and the transition of properties of GDLs. The pastes were heated at a heating temperature of 328° C. as described above in order to obtain the results shown in FIGS. 8 to 10 and the criteria for selecting the good product condition is as explained for FIG. 5.

As shown in these figures, when the difference in the temperature of decomposition between the high-temperature decomposed surfactant X and the low-temperature decomposed surfactant Y is 20° C., the good product condition can be obtained with the weight ratio B:A within the range of 5:1 to 6:1, resulting in exhibition of the effects described above. The same is true for other temperatures of decomposition, and thus when the difference in the temperature of decomposition is 40° C., the good product condition can be obtained with the weight ratio B:A within the range of 7:1 to 10:1 and when the difference in the temperature of decomposition is 50° C., the good product condition can be obtained with the weight ratio B:A within the range of 7:1 to 11:1, both resulting in exhibition of the effects described above.

As described above, the MPL paste of the embodiment contains the high-temperature decomposed surfactant X and the low-temperature decomposed surfactant Y which are surfactants for dispersing carbon particles in PTFE, the carbon particles imparting conductivity to GDLs of an anode side GDL 23 and a cathode side GDL 24. The MPL paste of the embodiment contains the high-temperature decomposed surfactant X and the low-temperature decomposed surfactant Y dispersed in PTFE with the weight ratio where the weight of the high-temperature decomposed surfactant X is minor. When the MPL paste of the embodiment is applied on a diffusion layer substrate which is then subjected to heat treatment, the heating temperature is higher than the temperature of decomposition of the high-temperature decomposed surfactant X and thus the temperature difference between the heating temperature and the temperature of decomposition of the low-temperature decomposed surfactant Y is increased. Due to the heat treatment, both high-temperature decomposed surfactant X and low-temperature decomposed surfactant Y are decomposed and eliminated. Because the MPL paste of the embodiment contains the high-temperature decomposed surfactant X and the low-temperature decomposed surfactant Y at the above weight ratio, the paste can have a wider range of the applicable condition (baking time) that provides the residual amount of the surfactants (appropriate residual amount) allowing both water repellency and bonding ability than that can be realized with an MPL paste only containing the low-temperature decomposed surfactant Y as shown in FIG. 4. The MPL paste of the embodiment allows production of GDLs that exhibits bonding ability due to the secured residual amount of the surfactants and water repellency due to prevention of excessive remaining of the high-temperature decomposed surfactant X thanks to defining the weight ratio as described above. As a result, the MPL paste of the embodiment allows reduction in the heating period by increasing the heating temperature during formation of GDLs, and thus reduction in the time required for formation of GDLs and reduction in cost. Reduction in the heating period may contribute to reduction in the travelling distance in a heating furnace in which the diffusion layer substrate containing the paste applied thereon travels, and thus the MPL paste of the embodiment also allows miniaturization of heating furnace facilities and reduction in the cost for facilities. The MPL paste of the embodiment can also provide, because the range of the applicable condition (baking time) is extended, GDLs having both water repellency and bonding ability even when there are variations in the produced GDLs or in the heating temperature.

The MPL pastes of the embodiment contain the high-temperature decomposed surfactant X and the low-temperature decomposed surfactant Y at a weight ratio such that the weight of the high-temperature decomposed surfactant X is decreased as the difference in the temperature of decomposition between the surfactants is increased (see FIG. 7). It may give increased options for the surfactants and for combinations thereof while allowing exhibition by the GDL of the bonding ability due to the secured residual amount of the surfactants compared to the paste containing only the low-temperature decomposed surfactant Y and exhibition by the GDL of water repellency due to prevention of excessive remaining of the high-temperature decomposed surfactant X.

The MPL paste of the embodiment contains the high-temperature decomposed surfactant X and the low-temperature decomposed surfactant Y at a weight ratio of 6:1 to 8:1, wherein the difference in the temperature of decomposition between the surfactants is 30° C. Accordingly the residual amount of the surfactants can be secured compared to the case where the paste contains only the low-temperature decomposed surfactant Y and excessive remaining of the high-temperature decomposed surfactant X is prevented, and thus the water repellency and bonding ability of GDLs can be highly effectively secured.

The method for producing the MPL paste of the embodiment employs, as shown in FIG. 3, a conventional dispersion method except that the high-temperature decomposed surfactant X and the low-temperature decomposed surfactant Y are contained at a controlled weight ratio. Thus according to the method for producing the MPL paste of the embodiment, the MPL paste can be easily obtained that allows preparation of GDL exhibiting both bonding ability due to the secured residual amount of the surfactants and water repellency due to prevention of excessive remaining of the high-temperature decomposed surfactant X.

The method for producing a GDL of the embodiment employs conventional production methods such as paste application and subsequent heat treatment as illustrated in FIG. 3 except that the MPL paste contains the high-temperature decomposed surfactant X and the low-temperature decomposed surfactant Y at the above weight ratio. According to the method for producing the GDL of the embodiment, both GDLs of an anode side GDL 23 and a cathode side GDL 24 that can exhibit bonding ability and water repellency can be easily prepared.

The invention is not limited to the above embodiments and can be practiced with various configurations within the scope that does not depart the purpose thereof. For example, technical features of the embodiments corresponding to the technical features in the modes described in Summary of the Invention can be appropriately replaced or combined in order to solve some or all problems as described above or in order to achieve some or all effects as described above. The technical feature that is not described herein as essential may be appropriately omitted.

The invention claimed is:

1. A paste for diffusion layer formation used for formation of a gas diffusion layer for a fuel cell comprising:
   a solvent;
   conductive particles dispersed in the solvent;
   a first surfactant which is dispersed in the solvent and has a first decomposition temperature at which the first surfactant is decomposed; and
   a second surfactant which is dispersed in the solvent and has a second decomposition temperature at which the second surfactant is decomposed, the second decomposition temperature being lower than the first decomposition temperature,
   wherein the paste for diffusion layer formation contains a lower amount of the first surfactant than the second surfactant on a weight basis, a difference between the first decomposition temperature and the second decomposition temperature is 30 to 40° C., and a weight ratio between the first surfactant and the second surfactant is 1:6 to 1:8.

2. The paste for diffusion layer formation according to claim 1, wherein the weight ratio between the first surfactant and the second surfactant is set inversely to the difference between the first decomposition temperature and the second decomposition temperature.

3. A method for producing a paste for diffusion layer formation used for formation of a gas diffusion layer for a fuel cell comprising:

a preparation step of preparing a first surfactant having a first decomposition temperature at which the first surfactant is decomposed and a second surfactant having a second decomposition temperature at which the second surfactant is decomposed, the second decomposition temperature being lower than the first decomposition temperature; and a dispersion step of dispersing conductive particles, the first surfactant and the second surfactant in a solvent, wherein in the preparation step, an amount of the first surfactant is lower than that of the second surfactant on a weight basis, a difference between the first decomposition temperature and the second decomposition temperature is 30 to 40° C., and a weight ratio between the first surfactant and the second surfactant is 1:6 to 1:8.

4. The method according to claim 3, wherein the weight ratio between the first surfactant and the second surfactant is set inversely to the difference between the first decomposition temperature and the second decomposition temperature.

5. A method for producing a gas diffusion layer for a fuel cell comprising:

an application step of applying a paste for diffusion layer formation on a diffusion layer substrate, the paste containing conductive particles, a first surfactant having a first decomposition temperature and a second surfactant having a second decomposition temperature that is lower than the first decomposition temperature, all of which are dispersed in a solvent; and a drying step of subjecting the diffusion layer substrate, which has been applied with the paste, to a heat treatment, wherein in the application step, the paste including a lower amount of the first surfactant than the second surfactant on a weight basis is applied on the diffusion layer substrate, and in the heat treatment, the first surfactant is decomposed at the first decomposition temperature and the second surfactant is decomposed at the second decomposition temperature, a difference between the first decomposition temperature and the second decomposition temperature is 30 to 40° C., and a weight ratio between the first surfactant and the second surfactant is 1:6 to 1:8.

6. The method according to claim 5, wherein the weight ratio between the first surfactant and the second surfactant is set inversely to the difference between the first decomposition temperature and the second decomposition temperature.

* * * * *